( 12 ) United States Patent
Woychik et al.

(10) Patent No.: US 8,884,427 B2
(45) Date of Patent: Nov. 11, 2014

(54) LOW CTE INTERPOSER WITHOUT TSV STRUCTURE

(71) Applicant: Invensas Corporation, San Jose, CA (US)

(72) Inventors: Charles G. Woychik, San Jose, CA (US); Cyprian Emeka Uzoh, San Jose, CA (US); Michael Newman, Dublin, CA (US); Terrence Caskey, Santa Cruz, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 13/828,938

(22) Filed: Mar. 14, 2013

(65) Prior Publication Data

US 2014/0264794 A1   Sep. 18, 2014

(51) Int. Cl.
*H01L 23/34* (2006.01)
*H01L 23/495* (2006.01)
*H01L 21/58* (2006.01)
*H05K 1/02* (2006.01)

(52) U.S. Cl.
CPC .............. *H05K 1/0298* (2013.01); *H01L 21/58* (2013.01); *H01L 23/49506* (2013.01)
USPC ..... 257/723; 257/668; 257/724; 257/E23.001

(58) Field of Classification Search
CPC ................. H01L 23/5389; H01L 2224/02335; H01L 2224/12105; H01L 2224/13024; H01L 2225/06513; H01L 2225/1058
USPC ............................ 257/668, 723, 724, E23.001
See application file for complete search history.

(56) References Cited

U.S. PATENT DOCUMENTS

| | | | | |
|---|---|---|---|---|
| 4,829,403 A | * | 5/1989 | Harding | 361/704 |
| 4,855,868 A | * | 8/1989 | Harding | 361/723 |
| 5,030,796 A | * | 7/1991 | Swanson et al. | 174/524 |
| 5,406,117 A | * | 4/1995 | Dlugokecki et al. | 257/659 |
| 5,932,254 A | * | 8/1999 | Mitchell et al. | 425/117 |
| 5,990,418 A | * | 11/1999 | Bivona et al. | 174/546 |
| 6,046,910 A | * | 4/2000 | Ghaem et al. | 361/760 |
| 6,126,428 A | * | 10/2000 | Mitchell et al. | 425/110 |
| 6,127,724 A | * | 10/2000 | DiStefano | 257/675 |
| 6,255,738 B1 | * | 7/2001 | Distefano et al. | 257/788 |
| 6,365,975 B1 | * | 4/2002 | DiStefano et al. | 257/777 |
| 6,373,273 B2 | * | 4/2002 | Akram et al. | 324/756.05 |
| 6,602,740 B1 | * | 8/2003 | Mitchell | 438/127 |
| 6,873,039 B2 | * | 3/2005 | Beroz et al. | 257/687 |

(Continued)

FOREIGN PATENT DOCUMENTS

EP          2555240 A1   2/2013
WO    2005059993 A2    6/2005

OTHER PUBLICATIONS

International Search Report and Written Opinion for Application No. PCT/US2014/027699 dated Jul. 17, 2014.

*Primary Examiner* — Ida M Soward
(74) *Attorney, Agent, or Firm* — Lerner, David, Littenberg, Krumholz & Mentlik, LLP

(57) ABSTRACT

A microelectronic assembly including a dielectric region, a plurality of electrically conductive elements, an encapsulant, and a microelectronic element are provided. The encapsulant may have a coefficient of thermal expansion (CTE) no greater than twice a CTE associated with at least one of the dielectric region or the microelectronic element.

19 Claims, 5 Drawing Sheets

(56) References Cited

U.S. PATENT DOCUMENTS

| | | | |
|---|---|---|---|
| 7,501,839 B2* | 3/2009 | Chan et al. | 324/754.18 |
| 7,510,912 B2* | 3/2009 | Caletka et al. | 438/122 |
| 7,749,882 B2* | 7/2010 | Kweon et al. | 438/597 |
| 2010/0327421 A1* | 12/2010 | Luan | 257/687 |
| 2011/0080713 A1 | 4/2011 | Sunohara | |
| 2012/0187584 A1 | 7/2012 | Lin et al. | |
| 2012/0211885 A1 | 8/2012 | Choi et al. | |
| 2012/0267751 A1* | 10/2012 | Haba et al. | 257/499 |
| 2012/0267777 A1* | 10/2012 | Haba et al. | 257/737 |
| 2013/0050972 A1* | 2/2013 | Mohammed et al. | 361/807 |
| 2013/0093097 A1* | 4/2013 | Yu et al. | 257/774 |
| 2013/0161833 A1* | 6/2013 | Pendse | 257/777 |
| 2013/0214431 A1* | 8/2013 | Lin et al. | 257/777 |
| 2013/0295727 A1* | 11/2013 | Hsu et al. | 438/130 |
| 2014/0048951 A1* | 2/2014 | Lin et al. | 257/774 |

* cited by examiner

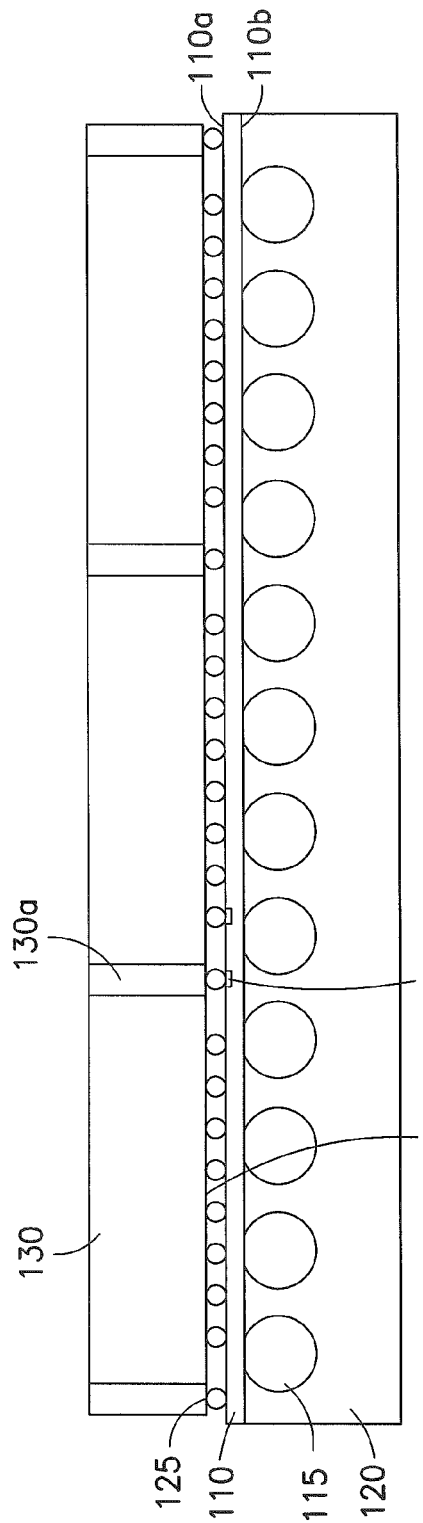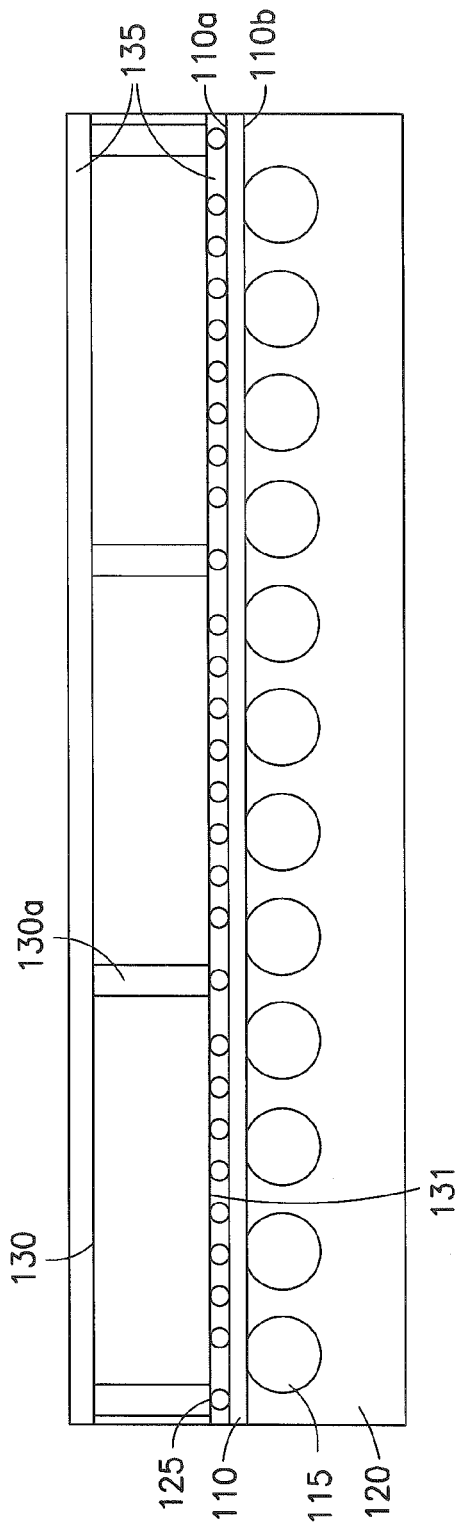

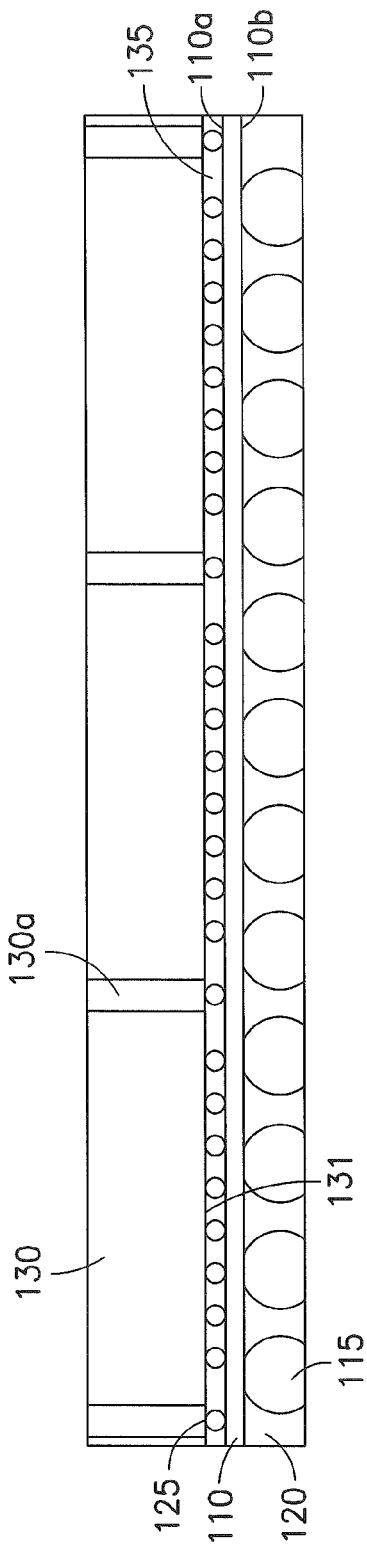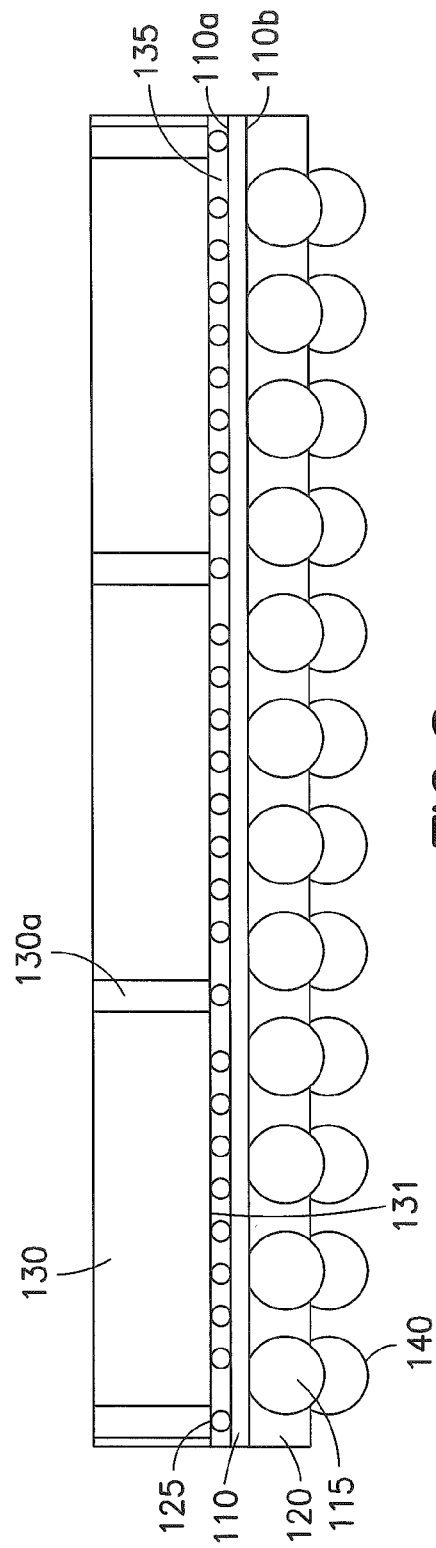

LOW CTE INTERPOSER WITHOUT TSV STRUCTURE

BACKGROUND OF THE INVENTION

The present disclosure relates to packaging of microelectronic devices, especially the packaging of semiconductor devices.

Microelectronic devices generally comprise a thin slab of a semiconductor material, such as silicon or gallium arsenide, commonly called a die or a semiconductor chip. Semiconductor chips are commonly provided as individual, prepackaged units. In some unit designs, the semiconductor chip is mounted to a substrate or chip carrier, which is in turn mounted on a circuit panel, such as a printed circuit board.

The active circuitry is fabricated in a first face of the semiconductor chip (e.g., a front surface). To facilitate electrical connection to the active circuitry, the chip is provided with bond pads on the same face. The bond pads are typically placed in a regular array either around the edges of the die or, for many memory devices, in the die center. The bond pads are generally made of a conductive metal, such as copper, or aluminum, around 0.5 micron ($\mu$m) thick. The bond pads could include a single layer or multiple layers of metal. The size of the bond pads will vary with the device type but will typically measure tens to hundreds of microns on a side.

An interposer can be used to provide electrical connections between microelectronic elements such as one or more unpackaged or packaged semiconductor chips with one another, or between one or more unpackaged or packaged semiconductor chips and other components such as an integrated passives on chip ("IPOC") having passive circuit elements thereon, discrete passive devices, e.g., capacitors, resistors, or inductors or a combination of the same, without limitation. An interposer can couple such chip or plurality of chips with other structure such as a circuit panel.

Size is a significant consideration in any physical arrangement of chips. The demand for more compact physical arrangements of chips has become even more intense with the rapid progress of portable electronic devices. Merely by way of example, devices commonly referred to as "smart phones" integrate the functions of a cellular telephone with powerful data processors, memory and ancillary devices such as global positioning system receivers, electronic cameras, and local area network connections along with high-resolution displays and associated image processing chips. Such devices can provide capabilities such as full internet connectivity, entertainment including full-resolution video, navigation, electronic banking and more, all in a pocket-size device. Complex portable devices require packing numerous chips into a small space. Moreover, some of the chips have many input and output connections, commonly referred to as "I/O's." These I/O's must be interconnected with the I/O's of other chips. The interconnections should be short and should have low impedance to minimize signal propagation delays. The components which form the interconnections should not greatly increase the size of the assembly. Similar needs arise in other applications as, for example, in data servers such as those used in internet search engines. For example, structures which provide numerous short, low-impedance interconnects between complex chips can increase the bandwidth of the search engine and reduce its power consumption.

Despite the advances that have been made in interposer structure and fabrication, further improvements can be made to enhance the processes for making interposers and the structures which can result from such processes.

BRIEF SUMMARY OF THE INVENTION

One aspect of the disclosure may provide a microelectronic assembly, including: a dielectric region having a first surface, a second surface opposite the first surface, and a plurality of traces extending in at least one direction parallel to the first and second surfaces and a plurality of contacts at the first surface of the dielectric region; a plurality of electrically conductive elements coupled to the traces and projecting above the second surface; an encapsulant extending above the second surface, the encapsulant filling spaces between adjacent conductive elements and having a surface overlying and facing away from the second surface, wherein ends of the conductive elements are at the surface of the encapsulant; a microelectronic element having a face and a plurality of element contacts at the face, the element contacts facing and joined to the plurality of contacts, wherein the encapsulant has a coefficient of thermal expansion (CTE) no greater than twice a CTE associated with at least one of the dielectric region or the microelectronic element.

In one example, the encapsulant can be a first encapsulant, the microelectronic assembly further comprising: a second encapsulant extending above the first surface.

In one example, the second encapsulant can have a CTE equal to a CTE of the first encapsulant.

In one example, the first and second encapsulants can encapsulate the dielectric region.

In one example, the microelectronic element can comprise at least two microelectronic elements spaced apart in the at least one direction parallel to the first surface.

In one example, the dielectric region can include a first layer of a first dielectric material and a second layer of a different dielectric material configured to function as a process stop layer.

In one example, the plurality of electrically conductive elements can include at least one mass of bonding material selected from the group consisting of solder, tin, indium, copper, nickel, gold, eutectic compositions, non-eutectic compositions, and an electrically conductive matrix material.

In one example, the plurality of electrically conductive elements can include a plurality of metal posts having at least a core consisting essentially of at least one metal selected from copper, copper alloy, nickel and nickel alloy, the posts having a melting temperature higher than 300° C.

In one example, the microelectronic assembly can further comprise a circuit panel, wherein the plurality of conductive elements are joined with corresponding contacts at a surface of the circuit panel.

In one example, the dielectric layer can be selected from a group consisting of a Back End of Line layer (BEOL) and a redistribution layer (RDL).

Another aspect of the disclosure may provide a microelectronic assembly as described above and one or more other electronic components electrically connected to the structure.

In one example, the system can further comprise a housing, said microelectronic assembly and said other electronic components being mounted with said housing.

Another aspect of the disclosure may provide an interposer, comprising: a dielectric region having a first surface, a second surface opposite the first surface, and a plurality of traces extending in at least one direction parallel to the first and second surfaces and a plurality of contacts at the first surface of the dielectric region; a plurality of electrically conductive elements coupled to the traces and projecting above the second surface; an encapsulant extending above the second surface, the encapsulant filling spaces between adjacent conductive elements and having a surface overlying and facing away from the second surface, wherein ends of the conductive elements are at the surface of the encapsulant, wherein the encapsulant has a coefficient of thermal expansion (CTE) no greater than twice a CTE associated with at least the dielectric region or a microelectronic element having contacts configured for flip-chip connection with the contacts at the first surface.

In one example, the second encapsulant can have a CTE equal to a CTE of the first encapsulant.

In one example, the dielectric region can include a first layer of a first dielectric material and a second layer of a different dielectric material configured to function as a process stop layer.

In one example, the plurality of electrically conductive elements can include at least one mass of bonding material selected from the group consisting of solder, tin, indium, copper, nickel, gold, eutectic compositions, non-eutectic compositions, and an electrically conductive matrix material.

In one example, the plurality of electrically conductive elements can include a plurality of metal posts having at least a core consisting essentially of at least one metal selected from copper, copper alloy, nickel and nickel alloy, the posts having a melting temperature higher than 300° C.

In one example, the dielectric layer can be selected from a group consisting of a Back End of Line layer (BEOL) and a redistribution layer (RDL).

Another aspect of the disclosure may provide a method of fabricating a microelectronic assembly, comprising: forming an encapsulant filling spaces between adjacent ones of electrically conductive elements projecting upwardly above a second surface of a dielectric region disposed on supporting structure, wherein a plurality of traces electrically connected with the conductive elements extend in at least one direction parallel to the first and second surfaces, the encapsulant having a surface overlying and facing away from the second surface, wherein ends of the conductive elements are at the surface of the encapsulant; removing least a portion of the thickness of the supporting structure in a direction towards the first surface of the dielectric region; assembling a microelectronic element having a face and a plurality of element contacts at the face such that the element contacts face and are joined to a plurality of contacts at the first surface, wherein the encapsulant has a coefficient of thermal expansion (CTE) no greater than twice a CTE associated with at least one of the dielectric region or the microelectronic element.

In one example, the method can further comprise: after assembling the microelectronic element removing a portion of the encapsulant at the surface of the encapsulant, thereby removing portions of the conductive elements at the surface of the encapsulant.

In one example, the method can further comprise: after removing the portion of the encapsulant, attaching a plurality of joining elements to the portions of the conductive elements at the surface, the joining elements configured to be joined with a plurality of contacts at a surface of a second component.

In one example, the encapsulant can be a first encapsulant, the method further comprising forming a second encapsulant, the second encapsulant extending above the first surface, the second encapsulant having a CTE equal to a CTE of the first encapsulant.

In one example, the method can further comprise: after assembling the microelectronic element with the dielectric region, abrading the microelectronic element at a surface of the microelectronic element opposite from the first surface of the dielectric region, so as to remove at least a portion of a thickness of the microelectronic element.

In one example, the microelectronic element can comprise a plurality of microelectronic elements.

In one example, the method can further comprise: joining the plurality of electrically conductive elements with corresponding contacts at a surface of a circuit panel.

In one example, the supporting structure and the dielectric region can be integrally formed.

In one example, the supporting structure can consist essentially of a first material and the dielectric region consists essentially of a second material.

In one example, the method can further comprise: depositing a process stop layer; and stopping a removal process utilizing the process stop layer.

BRIEF DESCRIPTION OF THE SEVERAL VIEWS OF THE DRAWINGS

FIG. 5 is a sectional view depicting a stage of fabrication of a microelectronic assembly including an interposer;

FIG. 6 is a sectional view depicting a stage of fabrication of a microelectronic assembly including an interposer;

FIG. 7 is a sectional view depicting a stage of fabrication of a microelectronic assembly including an interposer;

FIG. 8 is a sectional view depicting a stage of fabrication of a microelectronic assembly including an interposer;

DETAILED DESCRIPTION

Figure 1:
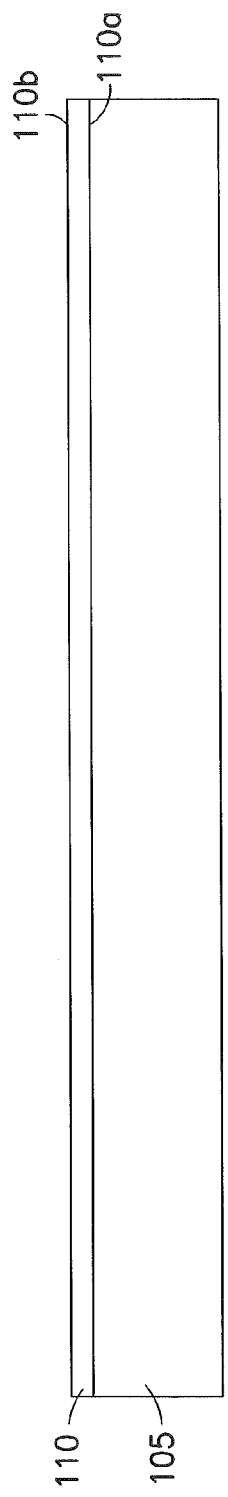
FIG. 1 is a sectional view depicting a stage of fabrication of a microelectronic assembly including an interposer.

FIG. 1 illustrates a stage in a method of fabrication of a microelectronic assembly including an interposer according to aspects of the disclosure. As shown at the stage depicted in FIG. 1, a dielectric region 110 is disposed atop a support element or supporting structure of thickness T. The supporting structure 105 may be formed of any material, and in some examples may be formed of silicon, a mold material, a glass substrate, or any additional materials in addition to the above. Typically, the dielectric region 110 is formed atop the supporting structure 105. For example, the dielectric region 110 may have a first surface 110a and a second surface 110b opposite the first surface 110a. In one example, the first surface 110a may be defined as an interface of the dielectric region 110 with the supporting structure 105. In other examples, the dielectric region 110 can be integrally provided with the supporting structure 105 and in some cases may be formed of the same dielectric material, such that the first surface 110a does not exist until later in fabrication.

Figure 2:
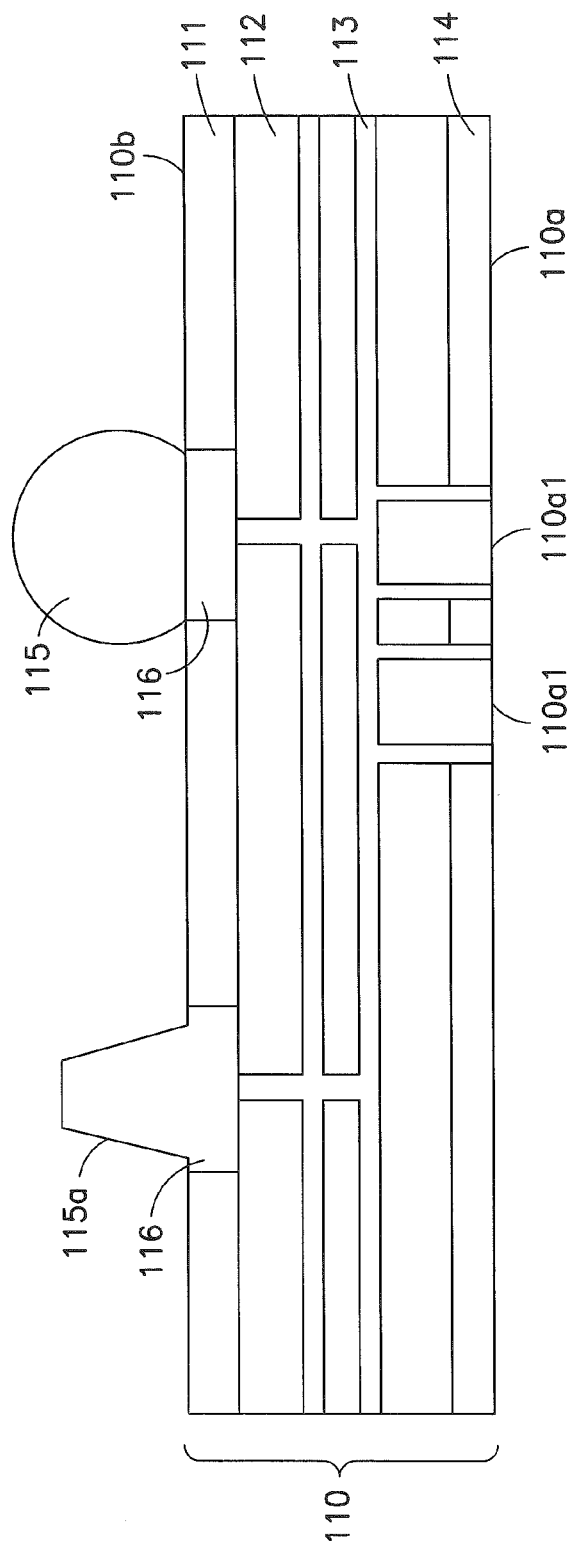
FIG. 2 is an enlarged sectional view of a dielectric region.

FIG. 2 is an enlarged sectional view illustrating dielectric region 110 and a set of traces and interconnects supported thereby. The dielectric region 110 may support one or more wiring layers and associated interconnect structures such as vias included in a back end of line ("BEOL") structure or redistribution structure. For example, the dielectric region 110 may include a plurality of dielectric layers 111, 112, and 114, and a plurality of traces 113, e.g., wiring layers, embedded within one or more of the dielectric layers 111, 112, and 114. The traces 113 may extend in any direction, and may extend parallel to, perpendicular to, or any other direction respect to the surfaces 110a, 110b of the dielectric region 110.

When the dielectric region 110 is a BEOL region, it may have a thickness T of approximately 50 nanometers to 10 micrometers. In other examples, the dielectric region may be or include a redistribution layer (RDL) with a greater thickness T and on which the width of traces 113 in a direction parallel to surface 110a may range from 20 nanometers to 20 micrometers, for example.

The dielectric layer 111 may be any type of dielectric layer, such as a solder mask. In other examples, the dielectric region 110 may not include the dielectric layer 111. The dielectric layers 112 may also be any type of dielectric layers, and in one example may include an oxide of silicon. The dielectric layer 114 may be any type of dielectric layer, and in one example may be a polish stop, grind stop, or other process stop layer, which when encountered during grinding, lapping or polishing of supporting structure 105 can in one example cause such process to halt or drastically slow down. Such layer can include or be made of a nitride of silicon, for example, when the dielectric layer includes silicon oxide. In one example, the process stop layer may be an endpoint layer or endpoint detection layer usable by process equipment upon reaching such layer such as for detecting the endpoint of a process.

In one example, the dielectric layers 111 and 112, as well as the traces 113 of the dielectric region 110 can be formed atop the dielectric layer 114. The dielectric layer 114, e.g, the polish stop, grind stop, or other process stop layer, may itself be formed atop the supporting structure 105, for example, by depositing the dielectric layer 114 atop the supporting structure 105.

One or more electrically conductive elements 115 can be provided which project above the second surface 110b of the dielectric region 110. As used herein, "above" and "upward" may not refer to a gravitational frame of reference, but may instead refer to a directional orthogonally away from a surface. In one example, the electrically conductive elements 115 can include conductive masses, e.g., solder balls, as shown in FIG. 2, which can be attached to electrically conductive elements such as metal pads 116 at surface 110b. At used herein, the term "at" may include elements that are available for connection at a surface, and may be even with the surface, recessed within the surface, or project above the surface. The pads 116, for example, may have dimensions in directions parallel to surface 110b of approximately 2 micrometers to 100 micrometers. For example, the conductive elements 115 may include at least one mass of bonding material, such as solder, tin, indium, copper, nickel, gold, eutectic compositions, non-eutectic compositions, and an electrically conductive matrix material. In another example, the conductive elements may be posts 115a, as seen in FIG. 2, such as may be formed by plating a metal onto pads or, alternatively by providing a layer of metal such as copper, copper alloy, nickel or nickel alloy, or a combination of such metals, and then etching such metal layer to form posts 115a. When formed by etching, the posts 115a may have a frustoconical shape as seen for example FIG. 2. The electrically conductive elements 115 may be any combination of the solder balls and posts as described above, as well as other types of electrically conductive elements. In this way, the conductive elements 115 may include a core that consists essentially of at least one metal selected from the group consisting of copper, copper alloy, nickel or nickel alloy, such posts having a melting temperature higher than 300° C.

A plurality of contacts 110a1 can be provided at the first surface 110a of the dielectric region 110. In one example, the contacts 110a1 may include microbump contacts for connecting to one or more microelectronic elements, as will be described in detail below.

In the configuration depicted, one or more of the contacts 110a1 may be electrically coupled with one or more of the electrically conductive elements 115, or conductive elements 115a through the traces 113. The contacts 110a1, electrically conductive elements 115, and traces 113 may be configured according to any desired configuration such that any desired configuration of interconnections among conductive elements and contacts 110a1 may be achieved.

It will be understood that the contacts 110a1 at surface 110a can be positioned thereat to have a minimum pitch which is the same as or different from the minimum pitch of the electrically conductive elements 115 or 115a provided at a surface 110b of the dielectric region 110 opposite therefrom. In particular examples, the minimum pitch of the conductive elements 115 can be greater than the minimum pitch of the contacts 110a1 by a ratio greater than 1:1, which in some examples may be greater than or equal to 2:1, or in other cases greater than or equal to 3:1, or possibly even greater.

The dielectric region 110 may have a coefficient of thermal expansion ("CTE") of up to 10 ppm/degree C., and in some cases may have a CTE of the same or close to a CTE of silicon or other semiconductor material, e.g., a CTE below 5 ppm/degree C.

Figure 3:
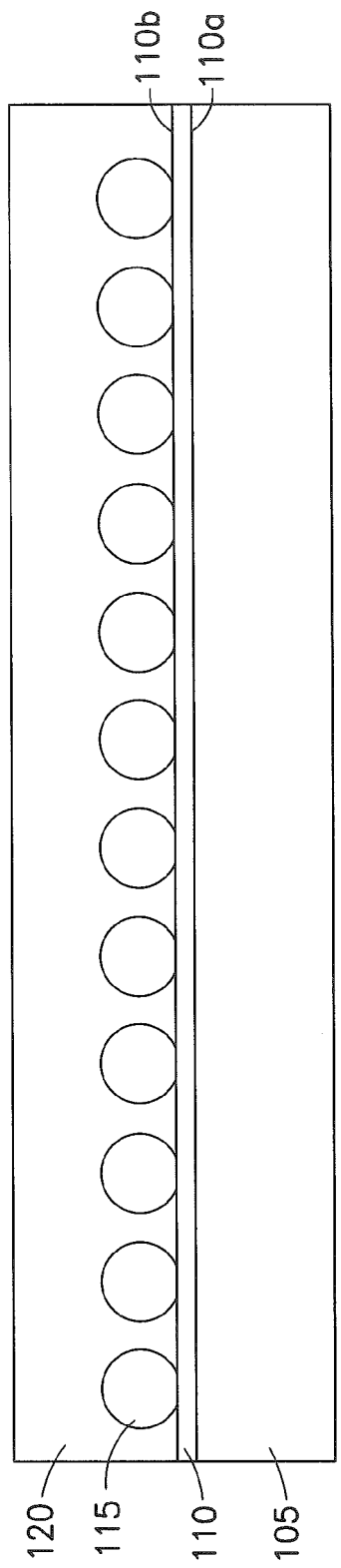
FIG. 3 is a sectional view depicting a stage of fabrication of a microelectronic assembly including an interposer.

As shown at FIG. 3, an encapsulant 120 may be provided on the second surface 110b of the dielectric region 110. In one example, the encapsulant 120 may be an overmold that may partially or completely encapsulate the electrically conductive elements 115. The encapsulant 120 may fill the spaces between adjacent electrically conductive elements 115. In one example, the encapsulant 120 may have a CTE in the range of up to 10 ppm/degree C.

Figure 4:
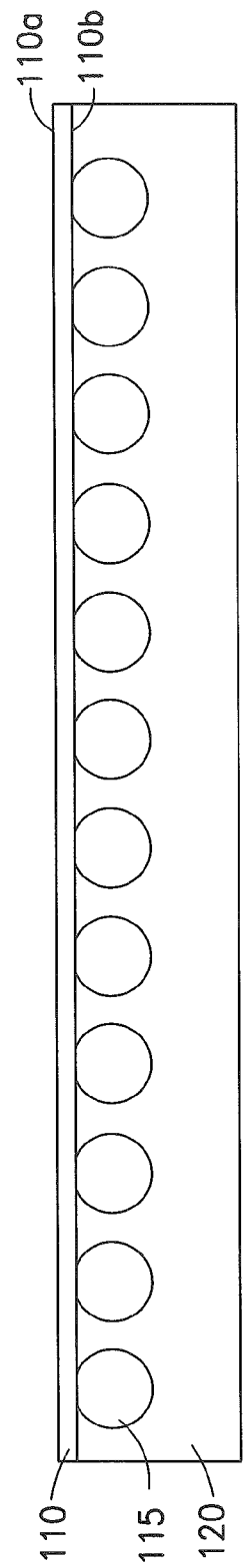
FIG. 4 is a sectional view depicting a stage of fabrication of a microelectronic assembly including an interposer.

Referring to FIG. 4 in comparison to FIG. 1, at least a portion of the thickness T of the supporting structure 105 may be removed from the first surface 110a of the dielectric region 110. This may be done, for example according to various methods, such as, for example, grinding, lapping or polishing, or de-bonding, cleaving, etching, or any combination of the above processes, which themselves may be combined with other processes. During the removal process, the dielectric layer 114, provided as a grind stop layer or endpoint detection layer, may be detected or exposed. This may help to ensure that the supporting structure 105, particularly one of semiconductor material or non-insulator, is removed completely, while also ensuring that no portion of the dielectric region 110 itself is removed.

As shown in FIG. 5, a plurality of microelectronic elements 130 may be positioned overlying the first surface 110a of the dielectric region 110. The microelectronic elements may have a coefficient of thermal expansion in the range of up to 10 ppm/degree C. In one example, the microelectronic elements 130 can be or include semiconductor chips having active circuit elements thereon, such as, e.g., transistors. The microelectronic elements 130 may be spaced apart in a direction parallel to the first surface 110a. In another example, microelectronic elements 130 can be or include passive circuit elements, such as integrated passives on chip ("IPOC"). Additional microelectronic elements 130a may also be provided. The microelectronic elements 130a may be passive microelectronic elements, such as passive die.

Each microelectronic element 130 has a face 131 and a plurality of contacts at the face 131 that may face and be joined with corresponding contacts 110a1 at a surface 110a of the dielectric region, such as with an electrically conductive bond metal. In the same way, elements 130a may also be joined with contacts 110a1.

As shown in FIG. 6, an encapsulant 135 may be provided which may extend above the surface 110a of the dielectric region, and between the surface 110a and the face 131 of the microelectronic element. The encapsulant may include an underfill and/or an overmold. In one example, the encapsulant 135 may have a higher CTE than a CTE associated with the encapsulant 120, particularly because the silicon in microelectronic elements 130 acts as a stiffener and has a higher Young's modulus. In other examples, the encapsulants 120 and 135 may have CTEs of the same value, or the encapsulant 135 may have a lesser CTE than that of the encapsulant 120.

As shown, the combination of the encapsulants 120 and 135 may each, or combination, at least partially or completely encapsulate the dielectric region 110. This may provide an assembly that is easier to handle. In other examples, the encapsulant 135 may be omitted from the assembly.

As shown in FIG. 7, a portion of the encapsulant 120 and/or the electrically conductive elements 115 may be removed to at least partially expose the electrically conductive elements 115. This may be accomplished by an abrasion process such as grinding, lapping, polishing, or the like. Alternatively, electrically conductive elements 115 which include conductive masses of solder, tin, or other electrically conductive material may be formed in contact with other electrically conductive structure or structures, e.g., pads 116, vias, traces, which are exposed during the removal process.

In one example, a portion of the encapsulant 135, as well as a portion of the microelectronic elements 130 may also be removed. This also may be accomplished by grinding, lapping, or the like.

As shown in FIG. 8, joining elements 140 may be attached to the contacts 130. The joining elements can made of or include electrically conductive masses of bonding material, such as for example, without limitation, solder, tin, a eutectic composition, or an electrically conductive matrix material, i.e., a polymeric material loaded with metal particles or flakes, for example. In particular examples, the joining elements can include metal elements which include low melting temperature and higher melting temperature components.

Figure 9:
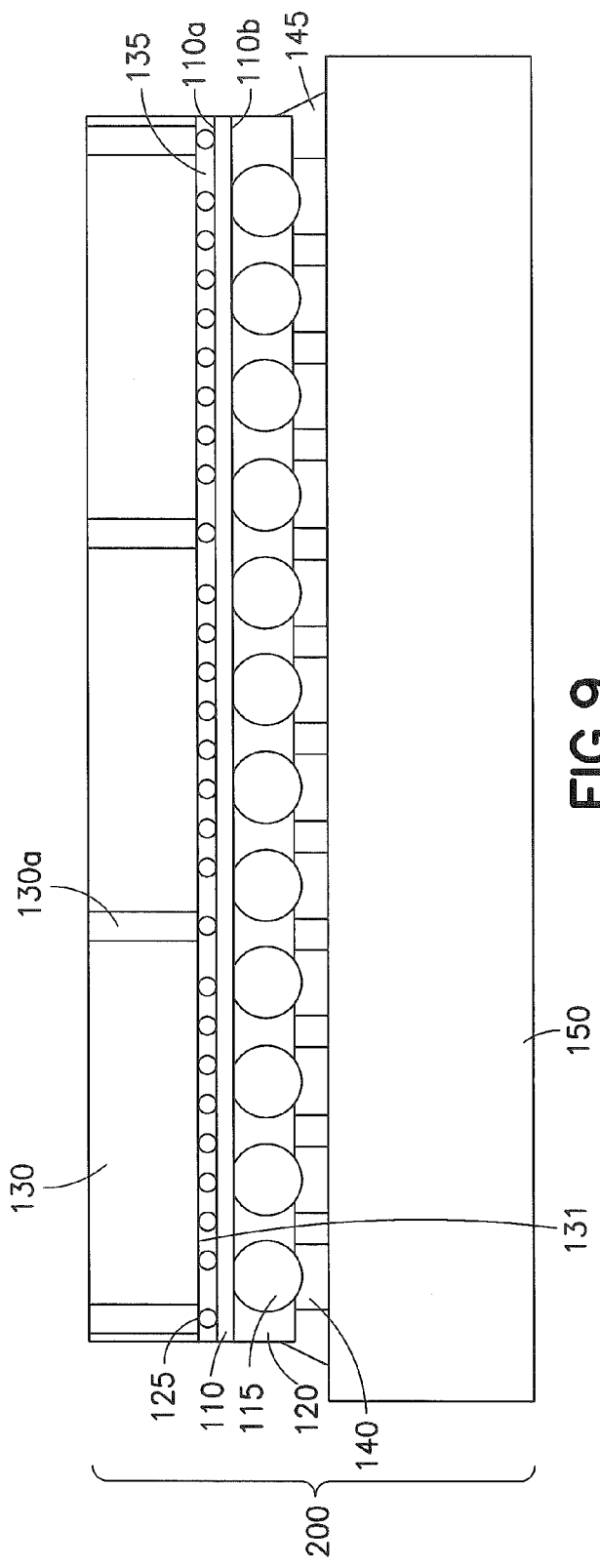
FIG. 9 is a sectional view depicting a stage of fabrication of a microelectronic assembly including an interposer.

FIG. 9 depicts a microelectronic assembly 200 including an interposer according to aspects of the disclosure. The interposer may include, for example, the dielectric region 110, electrically conductive elements 115, and the encapsulant 120. At this stage, the joining elements 140 may be connected to a substrate 150. In addition, an encapsulant 145, such as an underfill, may be provided to fill the spaces between the encapsulant 120, substrate 150, and the joining elements 140.

In one example, the encapsulant 120 may have a CTE no greater than twice the CTE associated with either the microelectronic element or the dielectric region 110 to which the microelectronic element is joined.

Although not depicted, the substrate 150 may be further connected to a circuit panel via substrate contacts (not shown) at a surface of the circuit panel. Additionally or alternatively, substrate 150 may itself be a circuit panel or may include passive, active, or other circuit elements.

Figure 10:
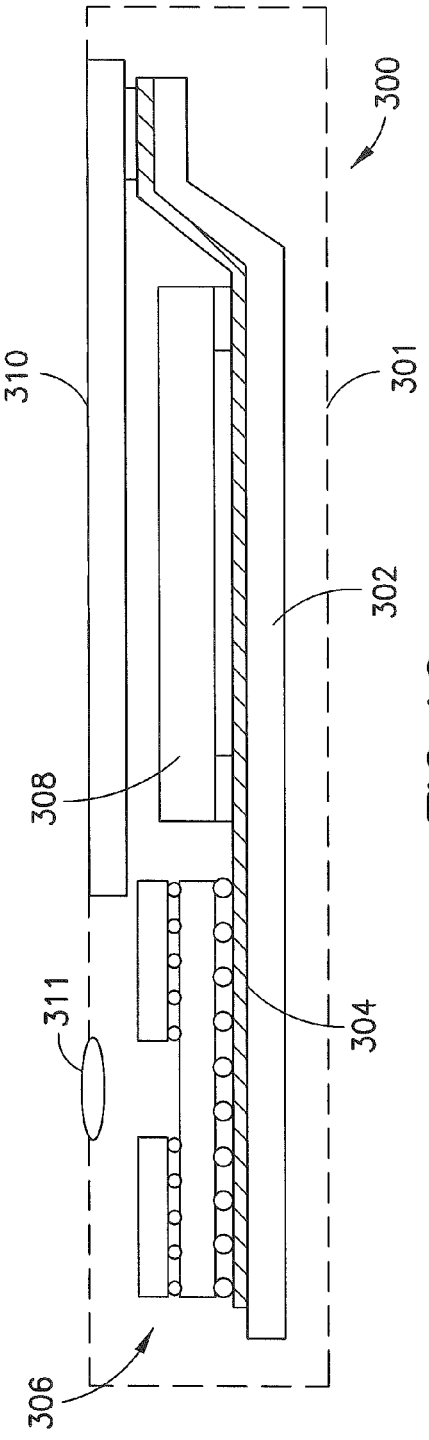
FIG. 10 is a sectional view depicting a system including a microelectronic assembly.

The structures discussed above provide extraordinary three-dimensional interconnection capabilities. These capabilities can be used with chips of any type. Merely by way of example, the following combinations of chips can be included in structures as discussed above: (i) a processor and memory used with the processor; (ii) plural memory chips of the same type; (iii) plural memory chips of diverse types, such as DRAM and SRAM; (iv) an image sensor and an image processor used to process the image from the sensor; (v) an application-specific integrated circuit ("ASIC") and memory. The structures discussed above can be utilized in construction of diverse electronic systems. For example, a system 300 in accordance with a further embodiment of the invention includes a structure 306 as described above in conjunction with other electronic components 308 and 310. In the example depicted, component 308 is a semiconductor chip whereas component 310 is a display screen, but any other components can be used. Of course, although only two additional components are depicted in FIG. 10 for clarity of illustration, the system may include any number of such components. The structure 306 as described above may be, for example, a microelectronic assembly as discussed above in connection with FIGS. 1-9. Structure 306 and components 308 and 310 are mounted in a common housing 301, schematically depicted in broken lines, and are electrically interconnected with one another as necessary to form the desired circuit. In the exemplary system shown, the system includes a circuit panel 302 such as a flexible printed circuit board, and the circuit panel includes numerous conductors 304, of which only one is depicted in FIG. 10, interconnecting the components with one another. However, this is merely exemplary; any suitable structure for making electrical connections can be used. The housing 301 is depicted as a portable housing of the type usable, for example, in a cellular telephone or personal digital assistant, and screen 310 is exposed at the surface of the housing. Where structure 306 includes a light-sensitive element such as an imaging chip, a lens 311 or other optical device also may be provided for routing light to the structure. Again, the simplified system shown in FIG. 10 is merely exemplary; other systems, including systems commonly regarded as fixed structures, such as desktop computers, routers and the like can be made using the structures discussed above.

As these and other variations and combinations of the features discussed above can be utilized without departing from the present invention, the foregoing description of the preferred embodiments should be taken by way of illustration rather than by way of limitation of the invention as defined by the claims.

The invention claimed is:

1. A microelectronic assembly, comprising:
   a dielectric region having a first surface, a second surface opposite the first surface, and a plurality of traces extending in at least one direction parallel to the first and second surfaces and a plurality of contacts at the first surface of the dielectric region;
   a plurality of electrically conductive elements coupled to the traces and projecting above the second surface;
   an encapsulant extending above the second surface, the encapsulant filling spaces between adjacent conductive elements and having a surface overlying and facing away from the second surface, wherein ends of the conductive elements are at the surface of the encapsulant;
   a microelectronic element having a face and a plurality of element contacts at the face, the element contacts facing and joined to the plurality of contacts,
   wherein the encapsulant has a coefficient of thermal expansion (CTE) no greater than twice a CTE associated with at least one of the dielectric region or the microelectronic element.

2. The microelectronic assembly of claim 1, wherein the encapsulant is a first encapsulant, the microelectronic assembly further comprising:

a second encapsulant extending above the first surface and between the first surface and the face of the microelectronic element.

3. The microelectronic assembly of claim 2, wherein the second encapsulant has a CTE equal to a CTE of the first encapsulant.

4. The microelectronic assembly of claim 2, wherein the first and second encapsulants encapsulate the dielectric region.

5. The microelectronic assembly of claim 1, wherein the microelectronic element comprises at least two microelectronic elements spaced apart in the at least one direction parallel to the first surface.

6. The microelectronic assembly of claim 1, wherein the dielectric region includes a first layer of a first dielectric material and a second layer of a different dielectric material configured to function as a process stop layer.

7. The microelectronic assembly of claim 1, wherein the plurality of electrically conductive elements includes at least one mass of bonding material selected from the group consisting of solder, tin, indium, copper, nickel, gold, eutectic compositions, non-eutectic compositions, and an electrically conductive matrix material.

8. The microelectronic assembly of claim 1, wherein the plurality of electrically conductive elements includes a plurality of metal posts having at least a core consisting essentially of at least one metal selected from copper, copper alloy, nickel and nickel alloy, the posts having a melting temperature higher than 300° C.

9. The microelectronic assembly of claim 1, further comprising a circuit panel, wherein the plurality of conductive elements is joined with corresponding contacts at a surface of the circuit panel.

10. The microelectronic assembly of claim 1, wherein the dielectric region is selected from a group consisting of a Back End of Line layer (BEOL) and a redistribution layer (RDL).

11. A system comprising a microelectronic assembly according to claim 1 and one or more other electronic components electrically connected to the structure.

12. A system as claimed in claim 11 further comprising a housing, said microelectronic assembly and said other electronic components being mounted with said housing.

13. The microelectronic assembly of claim 1, wherein the face of the microelectronic element overlies the first surface of the dielectric region, and the element contacts at the face of the microelectronic element are joined to the plurality of contacts with a bond metal.

14. An interposer, comprising:
a dielectric region having a first surface, a second surface opposite the first surface, and a plurality of traces extending in at least one direction parallel to the first and second surfaces and a plurality of contacts at the first surface of the dielectric region configured to be joined by flip-chip connection with corresponding element contacts of a microelectronic element, such as with a bond metal therebetween;
a plurality of electrically conductive elements coupled to the traces and projecting above the second surface;
an encapsulant extending above the second surface, the encapsulant filling spaces between adjacent conductive elements and having a surface overlying and facing away from the second surface, wherein ends of the conductive elements are at the surface of the encapsulant,
wherein the encapsulant has a coefficient of thermal expansion (CTE) no greater than twice a CTE associated with at least the dielectric region or the microelectronic element.

15. The interposer of claim 14, wherein the second encapsulant has a CTE equal to a CTE of the first encapsulant.

16. The interposer of claim 14, wherein the dielectric region includes a first layer of a first dielectric material and a second layer of a different dielectric material configured to function as a process stop layer.

17. The interposer of claim 14, wherein the plurality of electrically conductive elements includes at least one mass of bonding material selected from the group consisting of solder, tin, indium, copper, nickel, gold, eutectic compositions, non-eutectic compositions, and an electrically conductive matrix material.

18. The interposer of claim 14, wherein the plurality of electrically conductive elements includes a plurality of metal posts having at least a core consisting essentially of at least one metal selected from copper, copper alloy, nickel and nickel alloy, the posts having a melting temperature higher than 300° C.

19. The interposer of claim 13, wherein the dielectric region is selected from a group consisting of a Back End of Line layer (BEOL) and a redistribution layer (RDL).

* * * * *